US011705275B2

(12) United States Patent
Aljadeff et al.

(10) Patent No.: US 11,705,275 B2
(45) Date of Patent: Jul. 18, 2023

(54) SELF CALIBRATION BY DOUBLE SIGNAL SAMPLING

(71) Applicant: Panoramic Power Ltd., Kfar-Saba (IL)

(72) Inventors: Daniel Aljadeff, Kiriat Ono (IL); Dan Wijsboom, Ganei Tikva (IL); Yael Alali, Tel Aviv (IL); Adi Shamir, Kidron (IL)

(73) Assignee: PANORAMIC POWER LTD., Kfar Saba (IL)

( * ) Notice: Subject to any disclaimer, the term of this patent is extended or adjusted under 35 U.S.C. 154(b) by 8 days.

(21) Appl. No.: 16/952,907

(22) Filed: Nov. 19, 2020

(65) Prior Publication Data
US 2021/0165066 A1 Jun. 3, 2021

Related U.S. Application Data

(60) Provisional application No. 62/942,285, filed on Dec. 2, 2019.

(51) Int. Cl.
*G01R 35/00* (2006.01)
*H01F 38/30* (2006.01)
(Continued)

(52) U.S. Cl.
CPC .......... *H01F 38/30* (2013.01); *G01R 15/183* (2013.01); *G01R 15/186* (2013.01);
(Continued)

(58) Field of Classification Search
CPC .............. G01R 1/22; G01R 35/005–04; G01R 15/186; G01R 15/183; G01R 19/0007;
(Continued)

(56) References Cited

U.S. PATENT DOCUMENTS

| 4,891,764 A | * | 1/1990 | McIntosh | G05B 19/237 |
| | | | | 482/901 |
| 5,075,628 A | * | 12/1991 | Schuster | G01R 31/52 |
| | | | | 324/509 |

(Continued)

FOREIGN PATENT DOCUMENTS

| CN | 1790215 A | * | 6/2006 |
| CN | 101413995 A | | 4/2009 |

(Continued)

OTHER PUBLICATIONS

International Search Report and Written Opinion of International Searching Authority for PCT/IB2020/060943, ISA/IL, Jerusalem, Israel, dated Feb. 21, 2021.

(Continued)

*Primary Examiner* — Patrick Assouad
*Assistant Examiner* — Demetrius R Pretlow
(74) *Attorney, Agent, or Firm* — M&B IP Analysts, LLC

(57) ABSTRACT

A current transformer (CT) for the purpose of, for example, current measurement, that uses a power line as a first coil and a second coil for measurement purposes, is further equipped with a third coil. Circuitry connected to the third coil is adapted to measure a signal therefrom. The measured signal from the third coil is compared to a signal measured from the second coil and based on the results, internal CT parameters are determined allowing calibration of actual results to expected results thereby providing an improved accuracy. This is especially desirable when using the CT for measurement of the like of current or phase of the primary coil when measurements are adjusted using the newly determined calibration parameters.

22 Claims, 3 Drawing Sheets

(51) Int. Cl.
| | |
|---|---|
| *H01F 27/28* | (2006.01) |
| *H01F 27/24* | (2006.01) |
| *H03M 1/12* | (2006.01) |
| *H03M 1/66* | (2006.01) |
| *G01R 15/18* | (2006.01) |
| *G01R 19/18* | (2006.01) |
| *G01R 19/22* | (2006.01) |
| *H03H 7/06* | (2006.01) |
| *G01R 19/00* | (2006.01) |
| *G01R 35/04* | (2006.01) |

(52) U.S. Cl.
CPC ..... *G01R 19/0007* (2013.01); *G01R 19/0092* (2013.01); *G01R 19/18* (2013.01); *G01R 19/22* (2013.01); *G01R 35/005* (2013.01); *G01R 35/04* (2013.01); *H01F 27/24* (2013.01); *H01F 27/28* (2013.01); *H03H 7/06* (2013.01); *H03M 1/12* (2013.01); *H03M 1/66* (2013.01)

(58) Field of Classification Search
CPC .... G01R 19/0092; G01R 19/18; G01R 19/22; H01F 27/24; H01F 27/28; H03H 7/06; H03M 1/12
See application file for complete search history.

(56) References Cited

U.S. PATENT DOCUMENTS

| | | | |
|---|---|---|---|
| 5,446,682 A | 8/1995 | Janke et al. | |
| 5,450,328 A | 9/1995 | Janke et al. | |
| 5,995,911 A * | 11/1999 | Hart | G01R 15/183 |
| | | | 702/65 |
| 6,160,697 A * | 12/2000 | Edel | H01F 38/32 |
| | | | 361/146 |
| 6,279,115 B1 | 8/2001 | Baumgärtl et al. | |
| 6,577,111 B1 * | 6/2003 | Dickmander | H02M 3/33507 |
| | | | 323/356 |
| 7,305,310 B2 | 12/2007 | Slota et al. | |
| 7,557,563 B2 * | 7/2009 | Gunn | G01R 1/22 |
| | | | 324/127 |
| 7,598,724 B2 | 10/2009 | Howell et al. | |
| 7,660,682 B2 | 2/2010 | Slota et al. | |
| 7,788,055 B2 | 8/2010 | Colsch et al. | |
| 8,073,642 B2 | 12/2011 | Slota et al. | |
| 8,193,732 B2 | 6/2012 | Ayala et al. | |
| 8,587,399 B2 | 11/2013 | Crutcher et al. | |
| 8,698,426 B1 | 4/2014 | Nguyen et al. | |
| 8,847,576 B1 * | 9/2014 | Hannam | G01R 15/185 |
| | | | 324/330 |
| 9,134,348 B2 | 9/2015 | Shamir | |
| 9,411,003 B2 | 8/2016 | Danesh et al. | |
| 9,466,417 B2 | 10/2016 | Jefferies et al. | |
| 9,678,113 B2 * | 6/2017 | Shamir | H02M 3/1582 |
| 9,678,114 B2 | 6/2017 | Shamir et al. | |
| 9,720,017 B2 | 8/2017 | Shamir et al. | |
| 9,720,018 B2 | 8/2017 | Shamir et al. | |
| 9,726,700 B2 | 8/2017 | Shamir | |
| 9,964,568 B2 | 5/2018 | Shamir et al. | |
| 10,345,419 B2 * | 7/2019 | Neti | G01R 35/00 |
| 10,666,279 B1 | 5/2020 | Schumann et al. | |
| 11,300,591 B2 | 4/2022 | Boettcher et al. | |
| 2003/0151415 A1 | 8/2003 | Randall et al. | |
| 2005/0122092 A1 | 6/2005 | Claret et al. | |
| 2005/0225909 A1 * | 10/2005 | Yoshizaki | H02H 3/33 |
| | | | 361/42 |
| 2007/0096718 A1 | 5/2007 | Birlingmair et al. | |
| 2007/0136010 A1 * | 6/2007 | Gunn | G01R 15/185 |
| | | | 702/62 |
| 2011/0246088 A1 | 10/2011 | Santos | |
| 2012/0101760 A1 | 4/2012 | Sutrave et al. | |
| 2013/0076343 A1 * | 3/2013 | Carpenter | G01R 33/072 |
| | | | 324/252 |
| 2014/0340939 A1 * | 11/2014 | Daly | H02M 3/3376 |
| | | | 363/17 |
| 2015/0212159 A1 * | 7/2015 | Lu | H01F 27/24 |
| | | | 324/765.01 |
| 2016/0124024 A1 * | 5/2016 | Jefferies | G01R 35/02 |
| | | | 324/127 |
| 2016/0334443 A1 * | 11/2016 | Barczyk | G01R 19/0092 |
| 2017/0176567 A1 * | 6/2017 | Neti | G01R 35/00 |
| 2018/0122549 A1 * | 5/2018 | Lu | H01F 38/28 |
| 2018/0128859 A1 * | 5/2018 | Shamir | G01R 21/14 |
| 2018/0210014 A1 * | 7/2018 | Long | G01R 27/18 |
| 2019/0011283 A1 | 1/2019 | Soutar et al. | |
| 2021/0165066 A1 | 6/2021 | Aljadeff et al. | |
| 2021/0311153 A1 * | 10/2021 | Braginsky | G01R 19/0092 |

FOREIGN PATENT DOCUMENTS

| | | | | |
|---|---|---|---|---|
| CN | 103630724 A | | 3/2014 | |
| CN | 103630724 A | * | 3/2014 | |
| CN | 103901383 A | | 7/2014 | |
| CN | 104569897 A | | 4/2015 | |
| CN | 103630724 B | | 10/2015 | |
| CN | 204855773 U | * | 12/2015 | |
| CN | 106405299 A | * | 2/2017 | ............ G01R 31/00 |
| CN | 106707026 A | * | 5/2017 | ............ G01R 27/02 |
| CN | 106908635 A | * | 6/2017 | |
| CN | 107544045 A | * | 1/2018 | |
| CN | 207117186 U | * | 3/2018 | |
| CN | 106653336 B | * | 8/2018 | |
| CN | 108957140 A | | 12/2018 | |
| CN | 209656769 U | * | 11/2019 | |
| CN | 214337575 U | * | 10/2021 | |
| DE | 102014108384 A1 | * | 12/2014 | ......... G01R 35/005 |
| EP | 2666023 B1 | * | 3/2015 | ......... G01R 15/185 |
| JP | 2001066329 A | * | 3/2001 | |
| JP | 2001343404 A | * | 12/2001 | ......... G01R 15/186 |
| JP | 2019221075 A | * | 12/2019 | ........ G03G 15/2028 |
| RU | 81335 U1 | * | 3/2009 | |
| WO | WO-0017663 A2 | * | 3/2000 | ......... G01R 15/185 |

OTHER PUBLICATIONS

International Search Report and Written Opinion of International Searching Authority for PCT/IB2020/060980, ISA/IL, Jerusalem, Israel, dated Feb. 15, 2021.

* cited by examiner

SELF CALIBRATION BY DOUBLE SIGNAL SAMPLING

CROSS-REFERENCE TO RELATED APPLICATIONS

This application claims the benefit of U.S. Provisional Application No. 62/942,285, filed on Dec. 2, 2019, the respective contents is hereby incorporated by reference.

TECHNICAL FIELD

The disclosure generally relates to the calibration and error correction of current transformers (CT), and more particularly in split-core current transformers, used, for example, in non-intrusive and self-powered power sensors (SPPS).

BACKGROUND

In a typical electricity distribution system, power is provided through a main circuit breaker and a device for measurement of the power consumption of the entire electrical network connected thereto. However, typically, the main power line is then connected to a plurality of circuit breakers, each feeding a smaller section of the electrical network with its specific power requirements. The circuit breaker is adjusted to about the amount of maximum current that may be used by this electrical subnetwork. In industrial and commercial applications, hundreds of such circuit breakers may be installed, each controlling a section of the electrical network. Even in smaller locations, such as a house, it is not unusual to find tens of circuit breakers controlling various electrical subnetworks.

Non-intrusive measurement of current through a power line conductor has well known principles. A current transformer (CT) of sorts is created that comprises the primary winding as the power line conductor and the secondary providing an output current inversely proportionate to the number of windings. Typically such systems are used for measuring currents in very high voltage or current environments. Such types of apertures are useful for main power supplies. Using such devices, or power meters for that matter, is deficient for the purposes of measuring relatively low currents in an environment of a plurality of circuit breakers.

One of ordinary skill in the art would readily realize that split cores are used when non-intrusive installations of CTs is required, i.e., there is a need or requirement not to disconnect electrical wires when installing a CT. Example split-cores are shown in FIGS. 1A and 1B.

FIG. 1A depicts a schematic drawing of an assembled current transformer 100 having a split-core that comprised of elements 110 and 120. Also provided is a coil 130 wound around element 110 of the split-core. FIG. 1B shows a schematic drawing of a split core of the elements 110 and 120 of the split core of the CT 100 prior to assembly. A major problem with split core CT's is that the measurement result is highly sensitive to the air-gap that always exists between the two parts of the core. Due to production tolerances, there may be significant variations in the measurement result between seemingly identical cores due to, for example, miniature variations, which may be at an order of magnitude of tens of micro-meters, between their air-gaps. Such variations of the air-gaps may be the result of differences in the force applied to hold the respective split cores in place, dust accumulated in the gaps, different corrosion of the cores, humidity, and other factors that may impact the gap between the parts of the split core.

Moreover, such factors may also cause variations in the gap over time. As a result, such CT's cannot be practically used in applications requiring a high level of accuracy, such as, for example, revenue grade utility metering. Other sources of inaccuracy in CTs (not necessarily limited to those having a split core) are the number of winding which varies due to tolerances of the winding process, variations in the core cross section dimensions and magnetic material properties. One of ordinary skill in the art would readily appreciate that the cores are made of one or more ferromagnetic materials.

When using CT's to measure current, such inaccuracies are manifested in variations in the coupling factor, i.e., the ratio between primary and secondary signal amplitude, the position of the primary wire in respect to the CT, phase error, i.e., the phase shift between primary and secondary signal amplitudes, and temperature error coefficients, i.e., measurement errors due to variations in temperature. Several solutions have been proposed to the problem some of which involve manually configurable mechanical parts (such as variable resistors) assembled as part of the CT to tune the device. Others proposed solutions that include a matrix of passive components such as resistors, capacitors, and/or inductors, assembled as part of the CT. Such passive components are added and/or removed to tune the device.

Therefore, there is a need in the art to enable measurement and analysis of power consumption on a fine granularity at the device or circuit level.

Achieving a good accuracy in energy meter comprising CTs, often requires calibration of the meter and the CT. Identical CT's can very often vary in their response to current as well as in their inherent phase shift due to differences in manufacturing process of the core, coil wire winding etc. In many cases, the CT is provided separately from the meter, by a third party which is not the meter manufacturer and therefore calibrating the whole system becomes a very difficult task.

In addition to the difference between different CT's, individual CT's suffer from dynamic changes in their performance due to a different variables such as temperatures, and specifically in split core CT's, due to variable air gap.

It would be advantageous if a solution may be provided for self-calibration of CT's that is simple, cost effective and easy to maintain over long periods of time where the equipment is installed. It would be further advantageous to provide a self-calibration solution for a CT in general, and in particular a CT that includes a split core, when measuring electrical data.

SUMMARY

A summary of several example embodiments of the disclosure follows. This summary is provided for the convenience of the reader to provide a basic understanding of such embodiments and does not wholly define the breadth of the disclosure. This summary is not an extensive overview of all contemplated embodiments and is intended to neither identify key or critical elements of all embodiments nor to delineate the scope of any or all aspects. Its sole purpose is to present some concepts of one or more embodiments in a simplified form as a prelude to the more detailed description that is presented later. For convenience, the term "some embodiments" or "certain embodiments" may be used herein to refer to a single embodiment or multiple embodiments of the disclosure.

Certain embodiments disclosed herein include a system for self-calibration of a current transformer (CT). The system comprises a ferromagnetic core adapted to accommodate a current conducting wire passed therethrough, wherein the current conducting wire acts as a primary coil of the current transformer; a first coil wound around the ferromagnetic core, the first coil having a first connection point and a second connection point; a second coil wound around the ferromagnetic core, the second coil having a first connection point and a second connection point; a first analog-to-digital converter (ADC), a first analog front end (AFE), the first analog front end coupling the first ADC to a representation of a first analog signal appearing across the first and second connection points of the first coil and the first ADC providing a first digital signal as an output, the first digital signal being representative of the analog signal appearing across the first and second connection points of the first coil; a second analog-to-digital converter (ADC), and a second analog front end (AFE), the second analog front end coupling the second ADC to a representation of a second analog signal appearing across the first and second connection points of the second coil and the second ADC providing a second digital signal as an output, the second digital signal being representative of the analog signal appearing across the first and second connection points of the second coil; wherein the system is configured to determine, based on the first digital signal and the second digital signal, whether there is at least one CT calibration parameter that is different by a predetermined threshold value from a previously stored version of that CT calibration parameter and if so updating at least one CT calibration parameter to a value that will reduce a measurement error caused by the CT when measuring a current flowing through the primary coil of the CT.

Certain embodiments disclosed herein include a method for self-calibration of a current transformer (CT) wherein a current conducting wire passes therethrough, the current conducting wire acting as a primary coil of the current transformer. The method comprises: sampling a first secondary coil of the CT to measure its response to a current in the current conducting wire; sampling a second secondary coil of the CT to measure its response to a current in the current conducting wire; and determining at least one calibration parameter of the CT to be updated, wherein the determination is based on at least the sampling of the first secondary coil and the sampling of the second secondary coil.

BRIEF DESCRIPTION OF THE DRAWINGS

The subject matter of the disclosure is particularly pointed out and distinctly claimed in the claims at the conclusion of the specification. The foregoing and other objects, features and advantages will become apparent and more readily appreciated from the following detailed description taken in conjunction with the accompanying drawings, in which:

DETAILED DESCRIPTION

It is important to note that the embodiments disclosed herein are only examples of the many advantageous uses of the innovative teachings herein. In general, statements made in the specification of the present application do not necessarily limit any of the various claims. Moreover, some statements may apply to some inventive features but not to others. In general, unless otherwise indicated, singular elements may be in plural and vice versa with no loss of generality.

A current transformer (CT) for the purpose of, for example, current measurement, that uses a power line as a first coil and a second coil for measurement purposes, is further equipped with a third coil. Circuitry connected to the third coil is adapted to measure a signal therefrom. The measured signal from the third coil is compared to a signal measured from the second coil and based on the results, internal CT parameters are determined allowing calibration of actual results to expected results thereby providing an improved accuracy. This is especially desirable when using the CT for measurement of the like of current or phase of the primary coil when measurements are adjusted using the newly determined calibration parameters.

Figure 1A:
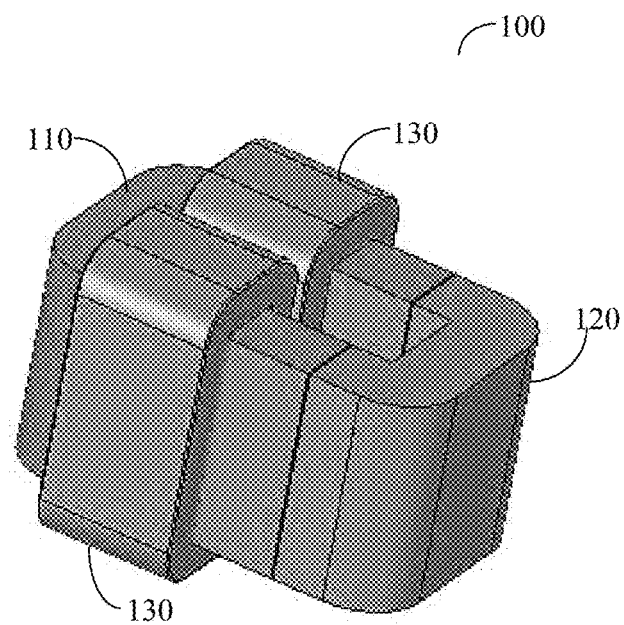
FIG. 1A is a schematic drawing of an assembled current transformer having a split-core.
Figure 1B:
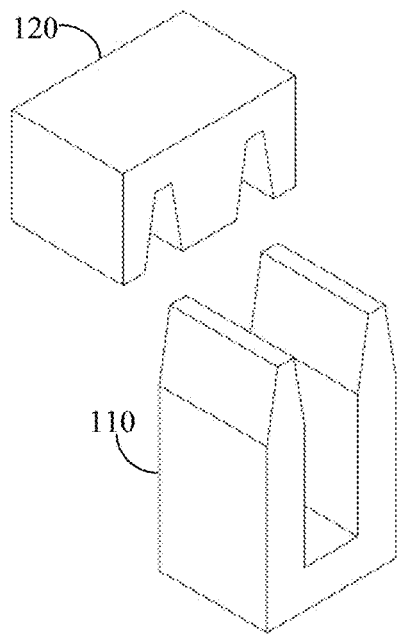
FIG. 1B is a schematic drawing of a split core of the current transformer prior to assembly.
Figure 2:
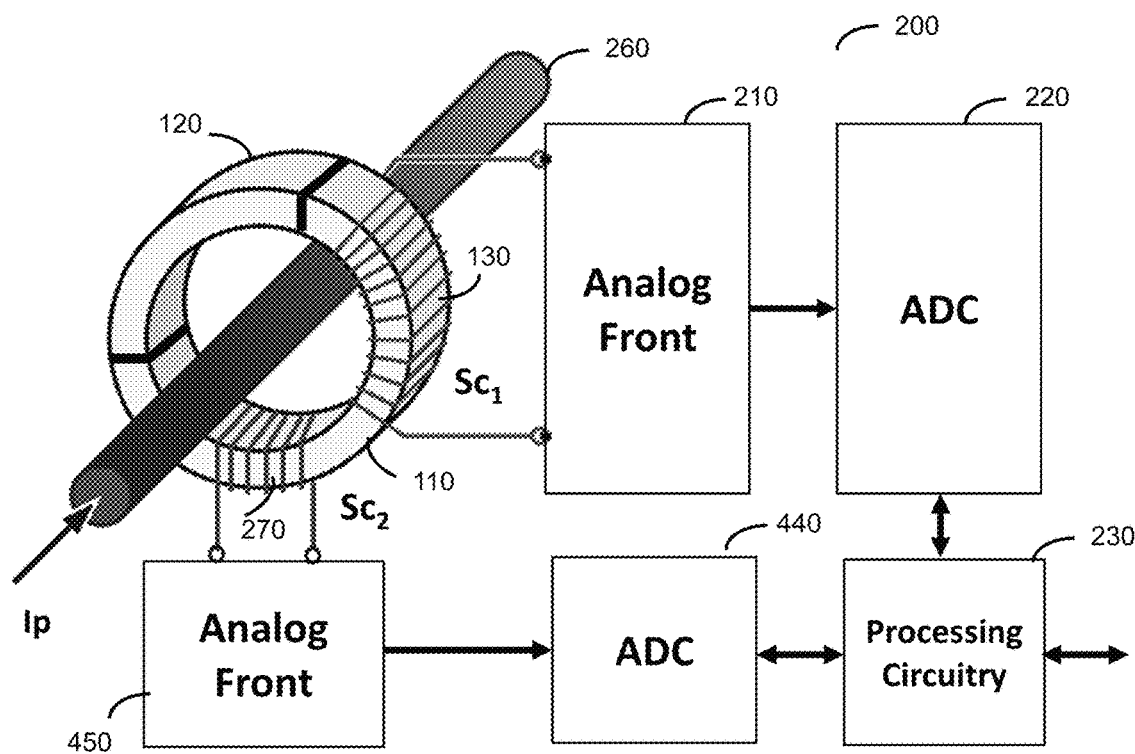
FIG. 2 is a schematic drawing of a system including a current transformer and self-calibration circuitry according to an embodiment.

FIG. 2 shows an example schematic drawing of a system 200 including a CT and self-calibration circuitry according to an embodiment. The CT includes a CT core that is made of a first element 110 and a second element 120 that are typically placed around a current line 260 that comprises a first coil of the CT, also referred to as a primary coil of the CT, the primary coil being a current conducting wire.

While a split-core CT is described herein it should be understood that the principles described herein are also applicable for non-split-core embodiments and therefore such cores should be considered an integral part of the description. A split-core may simply have more calibration needs than a non-split-core due to the airgap inherent to the split-core embodiment. It should be appreciated that the cores are made of one or more ferromagnetic materials. On the core, for example on element 110 there are wound two coils, the coil Sc1 130, also referred to as a first secondary coil, and the coil Sc2 270, referred also herein as a second secondary coil.

The first secondary coil 130 is electrically connected to an analog front-end (AFE) 210 which includes a burden resistor that captures the analog signal off the ports of the coil 130. The coil 130, as is well understood in the art, generates a current responsive and proportional to the current flowing through the current line 260. This current will generate a voltage on the burden resistor in the AFE 210. The generated voltage is then measured, through an electrical connection, to an analog-to-digital converter (ADC) that basically samples the analog signal into a series of numbers in ways well known in the art.

The ADC 220 is electrically connected to a processing circuitry 230, the processing circuitry may include, but is not limited to, a processor, a controller, volatile memory, non-volatile memory, logical gates, the like, and any combinations thereof. The processing circuitry 230 may, based on the sampled data received from the ADC 220, estimate the amplitude and the phase of the current flowing through the current line 260, compute power consumption and more, as further described in related prior art. However, due to CT losses (i.e. magnetizing impedance), estimating the amplitude and phase of the current line 260 is inaccurate.

The second secondary coil Sc2 270 is electrically connected to an analog front-end (AFE) 450 which comprises a burden resistor that captures the analog signal off of the ports of the coil 270. The second secondary coil 270, as is well understood in the art, generates a current responsive and proportional to the current flowing through the current line 260. This current will generate a voltage on the burden resistor of the AFE 450. The generated voltage is then measured, through an electrical connection, by an analog-to-digital converter (ADC) that samples the analog signal and converts it into a series of numbers in ways well known in the art. The ADC 440 is electrically connected to a processing circuit 230 that may include, but is not limited to, a processor, a controller, volatile memory, non-volatile memory, logical gates, the like, and any combinations thereof. According to an embodiment, the first secondary coil 130 and second secondary coil 270 have a different number of turns. According to an embodiment, the burden resistors connected to the first secondary coil 130 and second secondary coil 270 have a different resistance.

In one embodiment, the voltages sampled and measured on the first secondary coil 130 and second secondary coil 270 are used to compute internal parameters of the CT 110 like the internal magnetizing impedance. The magnetizing impedance depends on several factors including the Ip current flowing through the primary wire 260, the air gap characteristics, the placement of the primary wire 260 in the hole of the CT 110, input signal frequency and the CT temperature. In another embodiment, the voltages from the first secondary coil 130 and second secondary coil 270 are sampled simultaneously. This improves the accuracy of the calibration process. It allows a more accurate estimation of the phase shift between the two sampled voltages.

In yet another embodiment, the voltages on the first secondary coil 130 and second secondary coil 270 are sampled at different amplitudes of the current Ip flowing through the primary 260. Estimating the internal CT parameters at different amplitudes of the input current provides a better calibration accuracy including performing interpolation between computed values as much as needed. The processing circuit 230 keeps the CT calibration parameters estimated for each primary current amplitude.

According to an embodiment, a best fit polynomial is determined from the measured points. The processing circuitry can then estimate the calibration parameters for any measured current by using that polynomial and/or interpolating measured values or using any other mathematical method, well known to one of ordinary skill in the art. Based on the estimated internal parameters of the CT, the CT calibration factors may be estimated. Those may include, but are not limited to, amplitude calibration (i.e., gain calibration), phase calibration (i.e., phase shift of the CT), frequency response, ratio correction factor (RCF), transformer correction factor (TCF), final correction factor (FCF), excitation current, saturation current and other like calibration factors. The calibration factors used may be then applied on the current measured when flowing through the primary coil 260 to offset any inaccuracies resulting from the CT and the environment it is operating in, which may include the effects of temperature and humidity but are not limited thereto. It should be appreciated that additional reference schemes may be employed as well as a variety of combinations thereof.

In another embodiment, the same self-calibration principles are applied to a three-phase current transformer. As can be easily understood, the described self-calibration process can also be used as a self-test tool. If for some reason, one or more of the estimated calibration parameters is very different from an expected parameter; this may indicate that there is a CT failure. In yet another embodiment, the CT calibration parameters are periodically reported to a server (not shown) communicatively connected to the system 200, which compares the reported calibration parameters to previous parameters from the same CT and to parameters of similar CT's which may be further communicatively connected to the server. In an embodiment, the server is integrated in the system 200.

The server may then, make a decision if a CT is faulty or requires maintenance and make recommendations thereof. Such recommendations may be handled automatically or by messages to an operator requiring or suggesting certain actions to take place. It should be appreciated that the described self-calibration process can also be used as a self-test tool. If for some reason, one or more of the estimated calibration parameters are essentially different from an expected parameter, it may be an indication that there is a CT failure. It should be appreciated that the CT calibration process may be used with CT's comprising multiple secondary coils. In another embodiment more than two secondary coils may be used for the purpose of calibration without departing from the scope of the invention. That is, the description herein with respect of two secondary coils is for pedagogical reasons and is not intended to limit the scope of the invention.

Figure 3:
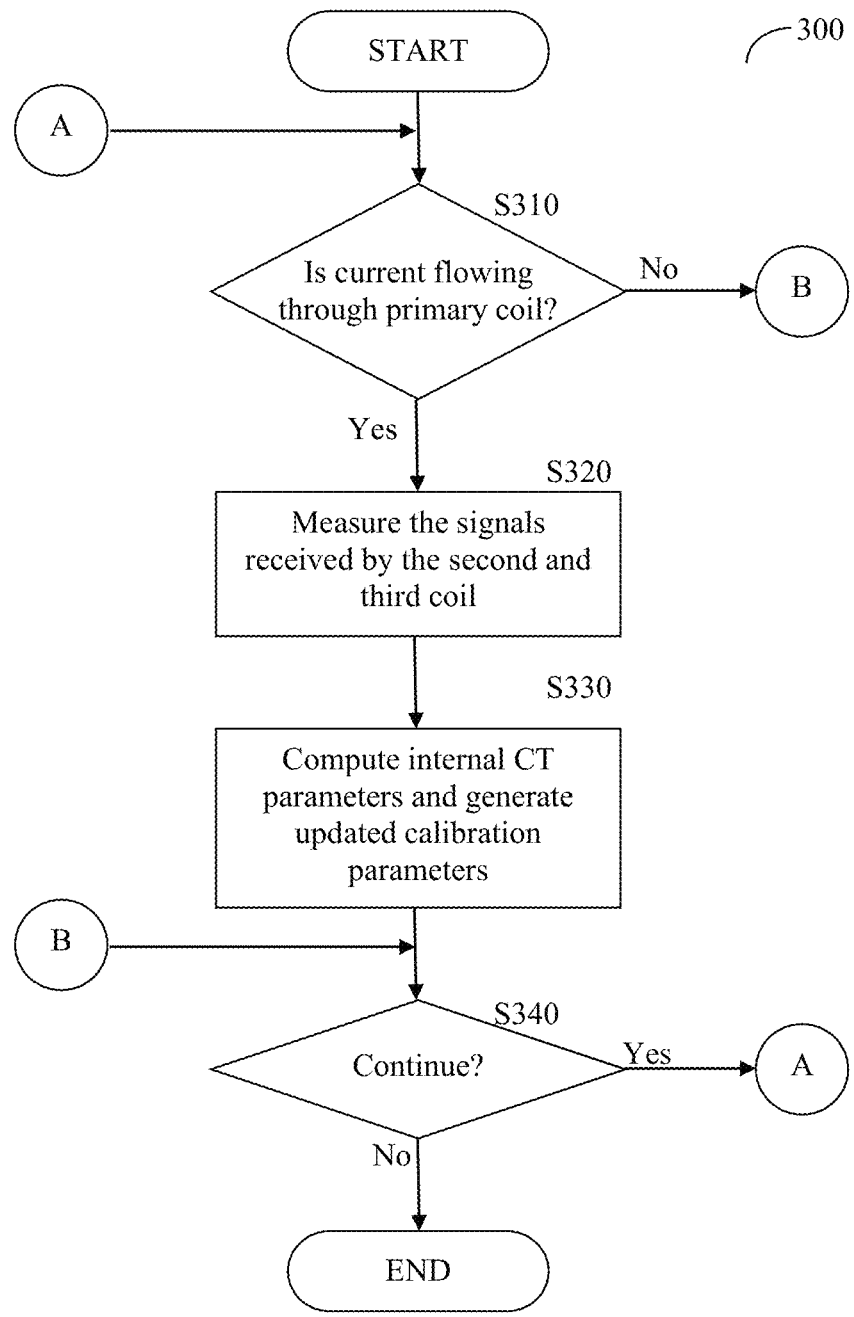
FIG. 3 is a flowchart of a self-calibrating current transformer according to an embodiment.

FIG. 3 shows an example flowchart 300 of a self-calibrating CT according to an embodiment. At S310 it is checked if current is flowing through the primary coil 260 and if not, execution continues with S340; otherwise, execution continues with S320. At S320 the voltages on the first secondary coil 130 and second secondary coil 270 are sampled (by their respective ADC units 220 and 440) and measured. At S330, internal CT parameters are computed and based on that the calibration parameters are updated so as to ensure that when the same input signal is provided again to the system 200, the parameters of the input current Ip are computed more precisely. At S340 it is checked whether to continue with the process of self-calibration and if so execution continues with S310; otherwise execution terminates.

Figure 4:
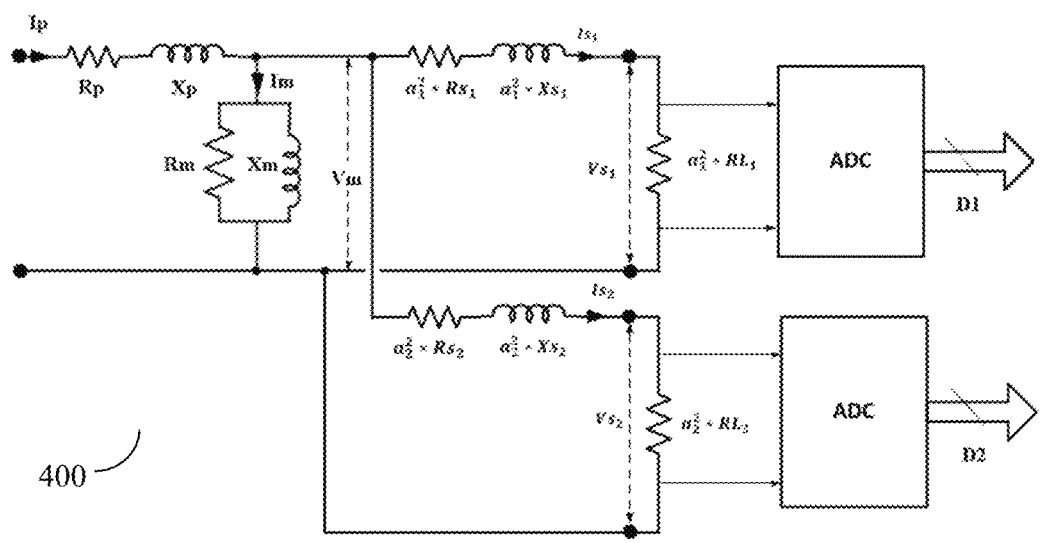
FIG. 4 is an equivalent circuit of a current transformer with two secondary coils as well as their load resistors according to an embodiment.

FIG. 4 shows an example equivalent circuit 400 of a current transformer with two secondary coils as well as their load resistors according to an embodiment. All the impedances in the circuit 400 are referred to the primary coil, although other equivalent circuits can also be used. The equivalent circuit 400 is used to compute the magnetizing impedance Zm of the CT. This is performed by sampling simultaneously the voltages Vs1 on the first secondary coil and Vs2 on the second secondary coil and estimating the amplitude of each voltage and their relative phase shift. According to one embodiment, the number of turns and/or load resistors in the first and second secondary coils, are different, and then the phase shift between the sampled voltages Vs1 and Vs2 may not be zero.

Once Zm (i.e. Rm and Xm) is known, the amplitude and phase of Ip can be determined by measuring Vs1. The equations for calculating Rm and Xm are henceforth described with respect of the equivalent circuit 400. The total impedance Zs of both secondary coils and their respective load resistors as referred to the primary can be denoted as following:

$$Z_s = K_n * \frac{(Rt_1 * Rt_2 - Xs_1 * Xs_2) + j(Xs_1 * Rt_2 + Xs_2 * Rt_1)}{(a_1^2 * Rt_1 + a_2^2 * Rt_2) + j(a_1^2 * Xs_1 + a_2^2 * Xs_2)}$$

Where:

$$a_1 = \frac{n_p}{ns_1}$$

$$a_2 = \frac{n_p}{ns_2}$$

$$K_n = a_1^2 + a_2^2$$

$$Rt_1 = Rs_1 + Rl_1$$

$$Rt_2 = Rs_2 + Rl_2$$

For the sake of simplicity, the equation above can be simplified to:

$$Z_S = R_S + jX_S$$

Where Rs is the total resistance of both secondary coils and their respective load (burden) resistors as referred to the primary; and, Xs is the total reactance of both secondary coils and their respective load (burden) resistors as referred to the primary. The total CT impedance ZCT and the load (burden) resistors as referred to the primary includes Zs (as computed above), the primary impedance Zp and the magnetizing impedance Zm. ZCT is therefore denoted as:

$$Z_{CT}[Re] = R_p + \frac{R_s * Zc_m * (R_m^2 + X_m^2) + X_m * (R_s^2 + X_s^2)}{(Zc_m * X_m + R_s)^2 + (Zc_m * R_m + X_s)^2}$$

$$Z_{CT}[Im] = X_p + \frac{R_m * (R_s^2 + X_s^2) + X_s * Zc_m * (R_m^2 + X_m^2)}{(Zc_m * X_m + R_s)^2 + (Zc_m * R_m + X_s)^2}$$

For the sake of simplicity, the above equation can be further simplified to:

$$Z_{CT} = Z_{CT}[Re] + jZ_{CT}[Im]$$

Where Rp is the resistance of the primary coil. In typical cases, the primary coil is a single wire passing through the CT core and where the wire has a very low resistance and typically can be ignored; Xp is the reactance of the primary coil where in typical cases, the primary coil is a single wire passing through the CT core, and where the wire has a very low reactance (single turn) and typically can be ignored; Zm is the CT magnetizing impedance; Rm is CT magnetizing resistance that comprises of: Eddy current losses—resistive heating in the core: proportional to the square of voltage applied to the transformer; Hysteresis losses—energy needed to rearrange magnetic domains in the core: nonlinear function of the voltage applied to the transformer; and, Leakage flux—flux that escapes from the core and flux that passes through one winding only; taking note that the copper losses (resistive heating in the windings) are denoted by Rp, Rs1 and Rs2; and, Xm is the CT magnetizing reactance that generates an additional phase shift between the current in the primary coil and the current in the secondary coils.

$$Z_m = Zc_m * (X_m + jR_m)$$

$$Zc_m = \frac{R_m * X_m}{R_m^2 + X_m^2}$$

Having the equation for ZCT, Vm, Vs1 and Vs2, can be all expressed as a function of Ip, Rm and Xm which are unknown. In the same way the relative phase between Vs1 and Vs2 can be expressed as a function of Ip, Rm and Xm which are unknown. Since Vs1 and Vs2 can be sampled and measured, and furthermore the relative phase between Vs1 and Vs2 can be measured, the values of Ip, Rm and Xm can be computed.

Since:

$$Z_m = f(I_p)$$

It should be appreciated that it is insufficient to compute Rm and Xm based on a single Ip value. As explained herein, the values of Rm and Xm need to be computed for different values of Ip. Once the values of Rm and Xm are computed for a range of Ip, it is possible to compute Ip with greater accuracy by measuring the value of Vs1. The primary current p is the vector sum of Im, Is1 and Is2. Since all the equivalent circuit components (i.e., resistance and reactance) are known, the value of the measured Vs1 can now be used to compute the amplitude of Ip and the phase of Ip in respect to Vs1.

It should be appreciated that other equivalent circuits may be used, all of them providing the same basic information which allows estimating the magnetizing impedance of the CT. Furthermore, it should be appreciated that the self-calibrating CT may be integrated within systems such as an analog front-end (AFE), a self-powered power sensor (SPPS), an energy meter and the like. In one embodiment a self-calibrating CT may be used with a multi-phase CT, and in particular a 3-phase CT. Furthermore, the methods described herein for a self-calibrating CT may be applied to voltage transformers (VTs) without departing from the scope of the disclosed embodiments.

The various embodiments disclosed herein can be implemented as hardware, firmware, software, or any combination thereof. Moreover, the software is preferably implemented as an application program tangibly embodied on a program storage unit or computer readable medium consisting of parts, or of certain devices and/or a combination of devices. The application program may be uploaded to, and executed by, a machine comprising any suitable architecture. Preferably, the machine is implemented on a computer platform having hardware such as one or more central processing units ("CPUs"), a memory, and input/output interfaces. The computer platform may also include an operating system and microinstruction code. The various processes and functions described herein may be either part of the microinstruction code or part of the application program, or any combination thereof, which may be executed by a CPU, whether or not such a computer or processor is explicitly shown. In addition, various other peripheral units may be connected to the computer platform such as an additional data storage unit and a display unit. Furthermore, a non-transitory computer readable medium is any computer readable medium except for a transitory propagating signal.

As used herein, the phrase "at least one of" followed by a listing of items means that any of the listed items can be utilized individually, or any combination of two or more of the listed items can be utilized. For example, if a system is described as including "at least one of A, B, and C," the system can include A alone; B alone; C alone; A and B in combination; B and C in combination; A and C in combination; or A, B, and C in combination.

All examples and conditional language recited herein are intended for pedagogical purposes to aid the reader in understanding the principles of the disclosed embodiment and the concepts contributed by the inventor to furthering the art, and are to be construed as being without limitation to such specifically recited examples and conditions. Moreover, all statements herein reciting principles, aspects, and embodiments of the disclosed embodiments, as well as specific examples thereof, are intended to encompass both structural and functional equivalents thereof. Additionally, it is intended that such equivalents include both currently known equivalents as well as equivalents developed in the future, i.e., any elements developed that perform the same function, regardless of structure.

What is claimed is:

1. A system for self-calibration of a current transformer (CT) comprising:
   a ferromagnetic core adapted to accommodate a current conducting wire passed therethrough, wherein the current conducting wire acts as a primary coil of the current transformer;
   a first coil wound around the ferromagnetic core, the first coil having a first connection point and a second connection point;
   a second coil wound around the ferromagnetic core, the second coil having a first connection point and a second connection point;
   a first analog-to-digital converter (ADC),
   a first analog front end (AFE), the first analog front end coupling the first ADC to a representation of a first analog signal appearing across the first and second connection points of the first coil and the first ADC providing a first digital signal as an output, the first digital signal being representative of the analog signal appearing across the first and second connection points of the first coil;
   a second analog-to-digital converter (ADC), and
   a second analog front end (AFE), the second analog front end coupling the second ADC to a representation of a second analog signal appearing across the first and second connection points of the second coil and the second ADC providing a second digital signal as an output, the second digital signal being representative of the analog signal appearing across the first and second connection points of the second coil;
   wherein the system is configured to determine, based on the first digital signal and the second digital signal, whether there is at least one CT calibration parameter that is different by a predetermined threshold value from a previously stored version of that CT calibration parameter and if so updating at least one CT calibration parameter to a value that will reduce a measurement error caused by the CT when measuring a current flowing through the primary coil of the CT.

2. The system of claim 1, wherein the ferromagnetic core is a split-core.

3. The system of claim 1, wherein at least one of the first coil and the second coil are a secondary coil.

4. The system of claim 1, wherein the measurement error reduced is an error in measurement of at least one of: amplitude and phase.

5. The system of claim 1, wherein at least one of the first AFE and the second AFE comprises a burden resistor.

6. An energy meter comprising the system of claim 1.

7. A self-powered power sensor (SPPS) comprising the system of claim 1.

8. The system of claim 1, wherein the CT calibration is performed periodically.

9. The system of claim 1, wherein the first AFE further comprises a first burden resistor and the second AFE further comprises a second burden resistor.

10. The system of claim 1, wherein the first burden resistor and the second burden resistor have different resistances.

11. The system of claim 1, wherein the first coil and the second coil each have a different number of turns.

12. The system of claim 1, further comprising:
   a processing circuitry and memory coupled thereto for making the determination and performing the updating of the CT calibration parameters.

13. The system of claim 12, wherein the processing circuitry is further adapted to calculate internal CT parameters at a plurality of different primary current amplitudes flowing through the primary coil of the CT.

14. The system of claim 12, wherein the system further comprises a server, wherein the server is configured to store at least one CT calibration parameter from the processing circuitry.

15. The system of claim 14, wherein the server is further configured to: compare the received at least a CT calibration parameter to at least one of: a historical value of the at least a CT calibration parameter and at least a corresponding at least one CT calibration parameter of a CT having substantially the same design parameters as does the CT.

16. The system of claim 14, wherein the server is further adapted to recommend at least a maintenance activity for the CT based on the comparison.

17. A method for self-calibration of a current transformer (CT) wherein a current conducting wire passes therethrough, the current conducting wire acting as a primary coil of the current transformer, comprising:
   sampling a first secondary coil of the CT to measure its response to a current in the current conducting wire;
   sampling a second secondary coil of the CT to measure its response to a current in the current conducting wire; and
   determining at least one calibration parameter of the CT to be updated, wherein the determination is based on at least the sampling of the first secondary coil and the sampling of the second secondary coil;
   wherein sampling of the first secondary coil and sampling of the second secondary coil is performed at substantially the same time.

18. A method for self-calibration of a current transformer (CT) wherein a current conducting wire passes therethrough, the current conducting wire acting as a primary coil of the current transformer, comprising:
   sampling a first secondary coil of the CT to measure its response to a current in the current conducting wire;
   sampling a second secondary coil of the CT to measure its response to a current in the current conducting wire; and
   determining at least one calibration parameter of the CT to be updated, wherein the determination is based on at least the sampling of the first secondary coil and the sampling of the second secondary coil;
   wherein sampling of the first secondary coil and sampling of the second secondary coil is performed at different amplitudes of the current flowing through the primary coil.

19. A method for self-calibration of a current transformer (CT) wherein a current conducting wire passes therethrough, the current conducting wire acting as a primary coil of the current transformer, comprising:

sampling a first secondary coil of the CT to measure its response to a current in the current conducting wire;
sampling a second secondary coil of the CT to measure its response to a current in the current conducting wire; and
determining at least one calibration parameter of the CT to be updated, wherein the determination is based on at least the sampling of the first secondary coil and the sampling of the second secondary coil;
wherein sampling of the first secondary coil and sampling of the second secondary coil is performed substantially immediately after determining that the current in the conducting wire is non-zero.

20. A method for self-calibration of a current transformer (CT) wherein a current conducting wire passes therethrough, the current conducting wire acting as a primary coil of the current transformer, comprising:
sampling a first secondary coil of the CT to measure its response to a current in the current conducting wire;
sampling a second secondary coil of the CT to measure its response to a current in the current conducting wire; and
determining at least one calibration parameter of the CT to be updated, wherein the determination is based on at least the sampling of the first secondary coil and the sampling of the second secondary coil;
wherein determining at least one calibration parameter coil further comprises:
comparing at least one sample from the first secondary coil with at least one substantially time coincident sample of the second secondary coil.

21. A method for self-calibration of a current transformer (CT) wherein a current conducting wire passes therethrough, the current conducting wire acting as a primary coil of the current transformer, comprising:
sampling a first secondary coil of the CT to measure its response to a current in the current conducting wire;
sampling a second secondary coil of the CT to measure its response to a current in the current conducting wire;
determining at least one calibration parameter of the CT to be updated, wherein the determination is based on at least the sampling of the first secondary coil and the sampling of the second secondary coil; and
comparing a value of the at least one of the at least one determined calibration parameter to at least one of: (i) a historical value of the determined at least one CT calibration parameter and (ii) at least a corresponding at least a CT calibration parameter of a CT having substantially the same design parameters as does the CT.

22. The method of claim 21, further comprising:
recommending at least a maintenance activity based on the comparison.

* * * * *